(12) United States Patent
Yamada et al.

(10) Patent No.: US 9,284,186 B2
(45) Date of Patent: Mar. 15, 2016

(54) SEMICONDUCTOR DEVICE AND METHOD OF MANUFACTURING THE SAME

(71) Applicants: Hiroshi Yamada, Kanagawa (JP); Hideyuki Funaki, Tokyo (JP); Kazuhiro Suzuki, Tokyo (JP); Kazuhiko Itaya, Kanagawa (JP); Armon Mahajerin, Berkeley, CA (US); Kevin Limkrailassiri, Newhall, CA (US); Liwei Lin, San Ramon, CA (US)

(72) Inventors: Hiroshi Yamada, Kanagawa (JP); Hideyuki Funaki, Tokyo (JP); Kazuhiro Suzuki, Tokyo (JP); Kazuhiko Itaya, Kanagawa (JP); Armon Mahajerin, Berkeley, CA (US); Kevin Limkrailassiri, Newhall, CA (US); Liwei Lin, San Ramon, CA (US)

(73) Assignees: Kabushiki Kaisha Toshiba, Tokyo (JP); The Regents of the University of California, Oakland, CA (US)

( * ) Notice: Subject to any disclaimer, the term of this patent is extended or adjusted under 35 U.S.C. 154(b) by 348 days.

(21) Appl. No.: 13/625,249

(22) Filed: Sep. 24, 2012

(65) Prior Publication Data

US 2014/0084392 A1    Mar. 27, 2014

(51) Int. Cl.
*B81C 1/00* (2006.01)
(52) U.S. Cl.
CPC .................. *B81C 1/00182* (2013.01)
(58) Field of Classification Search
CPC ................................. B81C 1/00936
USPC ........................... 257/416; 438/50
See application file for complete search history.

(56) References Cited

U.S. PATENT DOCUMENTS

| 7,875,481 | B2 | 1/2011 | Onozuka et al. | |
| 7,906,823 | B2 | 3/2011 | Suzuki et al. | |
| 8,008,760 | B2 | 8/2011 | Yamada et al. | |
| 2007/0177244 | A1 * | 8/2007 | Jang et al. | 359/290 |
| 2007/0273018 | A1 | 11/2007 | Onozuka et al. | |
| 2008/0318356 | A1 | 12/2008 | Onozuka et al. | |
| 2010/0084333 | A1 * | 4/2010 | Hoogerwerf et al. | 210/490 |
| 2010/0116632 | A1 * | 5/2010 | Smith et al. | 200/181 |
| 2010/0251826 | A1 * | 10/2010 | Choi et al. | 73/727 |
| 2011/0107962 | A1 * | 5/2011 | Chen et al. | 118/308 |
| 2012/0161257 | A1 * | 6/2012 | Friza et al. | 257/416 |
| 2013/0115775 | A1 * | 5/2013 | O'Brien | 438/702 |
| 2013/0210175 | A1 * | 8/2013 | Hoisington et al. | 438/21 |

FOREIGN PATENT DOCUMENTS

| JP | 2007-260866 | 10/2007 |
| JP | 2009-064954 | 3/2009 |
| JP | 2010-179401 | 8/2010 |
| JP | 2010-205771 | 9/2010 |

OTHER PUBLICATIONS

U.S. Appl. No. 13/766,195, filed Feb. 13, 2013, Yamada, et al.

* cited by examiner

*Primary Examiner* — Peniel M Gumedzoe
*Assistant Examiner* — Christopher Johnson
(74) *Attorney, Agent, or Firm* — Oblon, McClelland, Maier & Neustadt, L.L.P.

(57) ABSTRACT

After a TEOS oxide film is formed on the surface of a semiconductor device, a PSG film and an SiN film, which have air permeability, are formed on the surface of the TEOS oxide film. Thereafter, a Poly-Si film is formed thereon. A sacrifice layer is removed by a gaseous HF that passes through the PSG film, the SiN film, and the Poly-Si film, and then, the uppermost layer is covered with a Poly-Si/SiC film. A chip scale package having a thin-film hollow-seal structure can be realized on the semiconductor element.

8 Claims, 9 Drawing Sheets

SEMICONDUCTOR DEVICE AND METHOD OF MANUFACTURING THE SAME

FIELD

Embodiments described herein relate to a semiconductor device and a method of manufacturing the same.

BACKGROUND

In recent years, a high-integration technique of a semiconductor device has been developed. In the recent high-integration technique of a semiconductor device, an integration technique of a micro electro mechanical system (MEMS) has been required together with the integration technique of a large scale integration (LSI).

The MEMS (Micro Electro Mechanical System) is an electromechanical element having a microstructure manufactured by using a silicon microfabrication process. The MEMS has been expected to be applied in a wide range of electronic product such as a pressure sensor, an acceleration sensor, or RF filter. As one of the techniques for integrating the MEMS and LSI, there is a high-density three-dimensional packaging technology in which each of LSIs and MEMSs is stacked. However, in this technology, a through-hole in the vertical direction has to be formed on the LSI and MEMS, which results an increased processing cost. Therefore, a technique for a high integration on the same plane with reduced cost without forming the through-hole has been desired.

There are two representative systems, which are SOC (System on Chip) and SIP (System in Package) as methods for the high integration on the same plane. The SOC is a process for the integration by forming plural devices on one chip. The SOC can increase the integration of the device. However, there is limitation on the type of the device that can be integrated. For example, it is difficult to form a device made of another crystal system such as GaAs on a Si substrate, because of a difference in process. Further, a period needed for a design in order to realize a new SOC is long, which results in increased cost of development.

In contrast with the SOC, in the SIP, each LSI chip is independently formed, and then, each of them is independently mounted on an integrated substrate. In the SIP, each chip can independently be formed, so that there is no limitation on the chip to be integrated. Even when a new system is realized, an existing chip can be utilized. Therefore, a period for the design can be shortened, which provides an advantage of reducing cost of development. However, the integrated density of the chip depends upon the circuit board on which each chip is mounted. Therefore, it is difficult to arrange the chips with high density, compared to the SOC.

DETAILED DESCRIPTION

When a micro electro mechanical system (MEMS element) is applied to and mounted on an electronic apparatus, it is necessary to seal airtight the MEMS element in order to protect a movable part of the MEMS. Conventionally, the MEMS is mounted on a hermetic package made of a ceramic material, and a cap portion is hollow-sealed by welding.

However, in the sealing method using the ceramic hermetic package, the package size is extremely large, compared to the MEMS element. Therefore, the MEMS package size is a restriction for mounting on a small-sized electronic apparatus. In order to realize the small-sized electronic apparatus, a demand to put a small-sized MEMS package into practical use has been increased.

With respect to this object, it is considered that a silicon wafer having a concave portion formed thereon is mounted on an MEMS as a cap so as to realize MEMS hollow seal.

This method utilizes a material such as silicon (which may also be used as an MEMS sealing material for the MEMS), thereby being capable of preventing a stress destruction at a sealing portion caused by a difference in thermal expansion coefficient. Further, this method can realize the MEMS sealing on a wafer level, thereby being capable of realizing the MEMS sealing with low cost. This method also has an advantage that a package can be downsized, compared to the ceramic hermetic package.

However, the MEMS wafer level package technique described above utilizes, as a sealing material, a silicon wafer having a concave portion formed thereon, so that the silicon wafer becomes a restriction with respect to reduction in size from the viewpoint of reducing the size in the MEMS sealing. Therefore, there is limitation on downsizing the electronic apparatus.

Specifically, there is a technique that can realize both high integration, which cannot be attained by the conventional SIP, and combination property, which cannot be attained by the SOC, in a short period (see Japanese Unexamined Patent Publication No. 2007-260866). Specifically, an LSI and MEMS, which are manufactured by an independent specific manufacturing technique, are checked and sorted, and then, subject to a dicing to form an individual chip. Thereafter, they are rearranged to be adjacent to each other in a chip level to reconstruct as an MEMS integrated wafer. However, in the hollow-sealing using the silicon wafer having the concave portion formed thereon, the thickness of the MEMS sealing portion becomes a restriction for reducing the size of the integrated semiconductor device.

In view of this, it is considered that the MEMS sealing portion is sealed in a wafer level by using an organic resin film such as SU-8. However, since the organic resin film has low airtightness, the MEMS element that can be utilized is limited.

The semiconductor device and the method of manufacturing the same according to the present embodiment solve the conventional problems described above.

The embodiments will be described in detail below with reference to FIGS. 1 to 11.

(Embodiment of Semiconductor Device)

The semiconductor device according to the present embodiment will be described below with reference to FIGS. 1 and 2.

Figure 1:
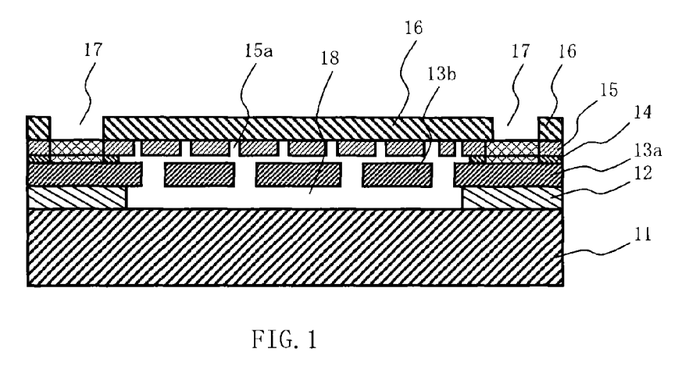
FIG. 1 is a sectional view illustrating a main part of a semiconductor device according to the first embodiment.
Figure 2:
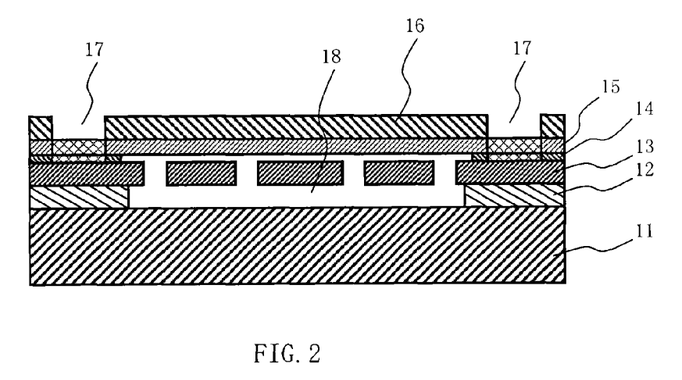
FIG. 2 is a sectional view illustrating a main part of a semiconductor device according to another embodiment.

FIG. 1 is a sectional view of the semiconductor device according to the present embodiment. FIG. 2 is a sectional view illustrating a semiconductor device according to another embodiment.

As illustrated in FIG. 1, the semiconductor device according to the present embodiment includes, on a semiconductor substrate 11, an insulating film layer (BOX layer) 12; an MEMS fixed portion 13a and an MEMS movable portion 13b formed by processing an SOI layer 13, which is formed on the insulating film layer (BOX layer) 12; a TEOS oxide film 14; a first inorganic thin film 15 having formed thereon etching holes 15a; a second inorganic thin film 16; and I/O electrode 17. The semiconductor substrate 11, the insulating film layer 12, the TEOS oxide film 14, the first inorganic thin film 15, and the second inorganic thin film 16 form a hollow space 18 that contains an MEMS element drive portion.

In the embodiment of the semiconductor device described above, the insulating film layer (BOX layer) 12 and the TEOS oxide film 14 are employed as the material constituting the sidewall face of the hollow space 18.

The reason why the insulating film layer (BOX layer) and the TEOS oxide film are used as the material for the sidewall surface is as follows. Specifically, by using the TEOS oxide film, a space greater than the deformation of the inorganic thin film on the MEMS movable portion can be formed with the TEOS oxide film used as a support column. Further, when the SOI region is filled again with the TEOS, a sacrifice layer can be removed at the same time together with the insulating film layer (BOX layer).

In the embodiment of the semiconductor device, first and second inorganic thin films 15 and 16 are used as a sealing member forming the hollow space of the MEMS element. The inorganic thin film is required to have airtightness, mechanical strength for sealing the MEMS element, and chemical stability and heat resistance in a semiconductor process. Especially, a surface layer is required to have rigidity and airtightness. A single film may be used without using plural thin film layers, as long as it satisfies the conditions described above.

It is preferable that the material for the first inorganic thin film 15 be selected from materials such as Poly-Si, PSG, SiN, and SiO. The first inorganic thin film 15 may be a composite thin film including plural materials.

It is preferable that the second inorganic thin film 16 be a Poly-Si/SiC composite thin film. This thin film has an excellent performance in view of the mechanical strength and airtightness including moisture resistance.

It is particularly preferable that at least one of the first and second inorganic thin films include a Poly-Si layer.

The semiconductor device according to the present embodiment provides a remarkable effect by which the semiconductor element including the MEMS element can be integrated with high density. Unlike the conventional MEMS sealing using the silicon wafer having a concave portion, the MEMS hollow-seal is realized with the inorganic thin film. Therefore, compared to the MEMS hollow-seal using the organic thin film, reliability is enhanced, and the thickness of the integrated semiconductor device can extremely be decreased.

In the embodiment illustrated in FIG. 1, the first inorganic thin film 15 is a film provided with an etching hole for allowing a gaseous HF to pass. However, when the first inorganic thin film 15 has permeability to gaseous HF, the film does not have to be provided with the etching hole as illustrated in FIG. 2.

(Another Embodiment of Semiconductor Device)

Figure 11:
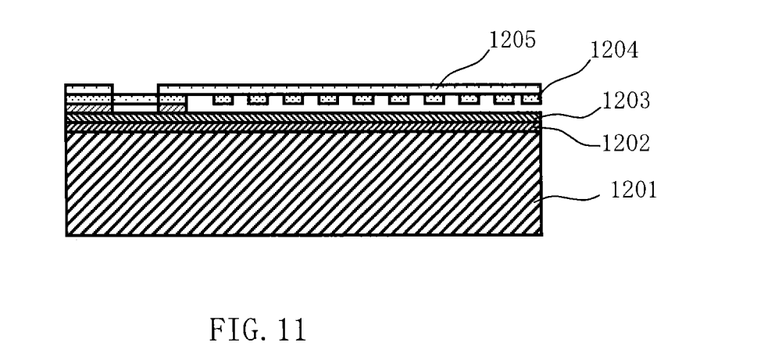
FIG. 11 is a sectional view illustrating a main part of a semiconductor device according to still another embodiment.

In the embodiment described above, the semiconductor device formed on the Si substrate has been described. However, the present embodiment can be applied to a compound semiconductor substrate. FIG. 11 illustrates this example. FIG. 11 is a sectional view illustrating a main part of the semiconductor device applied to a monolithic microwave integrated circuit (MMIC).

In FIG. 11, numeral 1201 denotes a compound semiconductor substrate, numeral 2012 denotes an insulating layer, and numeral 1203 denotes an element region of the compound semiconductor substrate. A hollow space is formed on the upper layer of the compound semiconductor region, and a first inorganic film 1204 provided with an etching hole is arranged at the upper layer. A second inorganic thin film 1205 is formed further thereon.

(First Embodiment of Method of Manufacturing Semiconductor Device)

A manufacturing method according to the present embodiment in which a hollow space and plural semiconductor elements are formed on a semiconductor substrate will be described below with reference to FIGS. 3 to 6. In the embodiment described below, a manufacturing process of a semiconductor element other than the MEMS element is omitted in the manufacturing process of the semiconductor device.

Figure 3A:
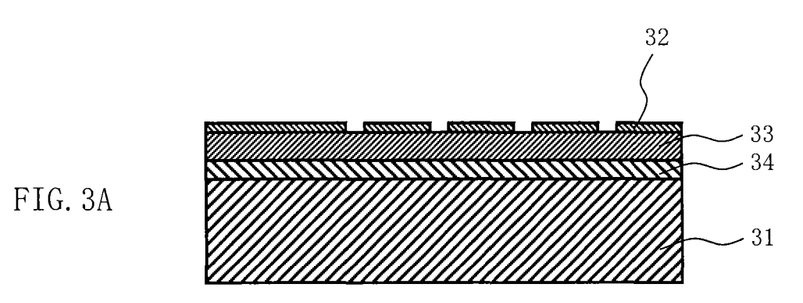
FIG. 3A is a sectional view for describing a process of a method of manufacturing the semiconductor device according to the first embodiment.

(First Step: FIG. 3A)

An insulating film layer (BOX layer) 34 is first formed on a semiconductor substrate 31 in accordance with a CVD method or an oxidation method in which the semiconductor substrate is heated under oxidizing atmosphere containing oxygen gas or water content. Subsequently, an SOI layer 33 is formed on its surface. Further, a resist is formed by an application method on its surface, whereby a resist pattern 32 for forming a movable portion of an MEMS is formed by optical lithography.

Figure 3B:
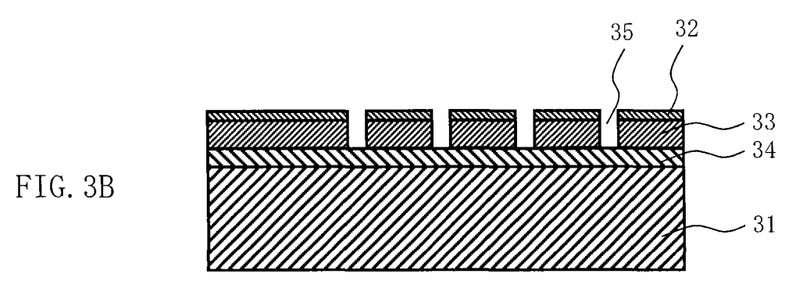
FIG. 3B is a sectional view for describing a process of a method of manufacturing the semiconductor device according to the first embodiment.

(Second Step: FIG. 3B)

A processed trench that forms the MEMS is formed on the SOI layer 33 with the use of Deep-RIE method by using the resist pattern 32 as a mask. In this process, the portion other than the region 35 that is removed by etching becomes the MEMS movable portion.

Figure 3C:
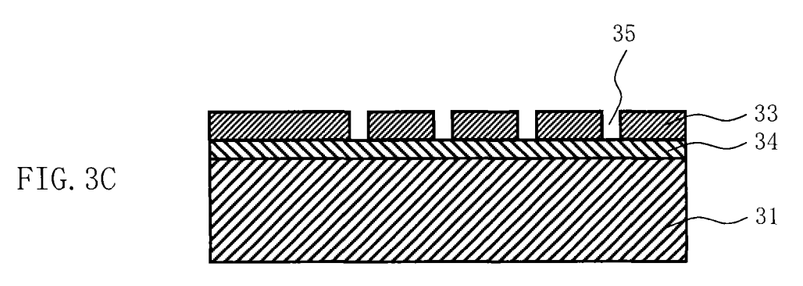
FIG. 3C is a sectional view for describing a process of a method of manufacturing the semiconductor device according to the first embodiment.

(Third Step: FIG. 3C)

The resist pattern 32 is peeled. The resist pattern is peeled by a method such as an ashing method in which the resist is made into ash by using a resist stripping liquid or by application of heat under oxidation atmosphere.

Figure 4A:
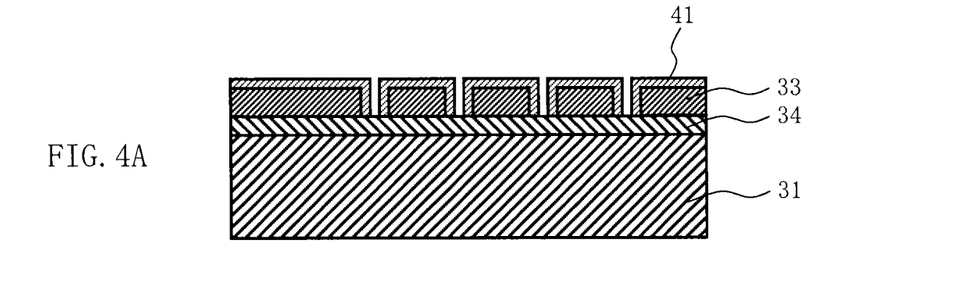
FIG. 4A is a sectional view for describing a process of the method of manufacturing the semiconductor device according to the first embodiment.

(Fourth Step: FIG. 4A)

A TEOS oxide film 41 is formed on the surface of the semiconductor substrate, on which the processed trench is formed in the second step, so as to cover the processed trench on the SOI layer 33 with an LPCVD method.

Figure 4B:
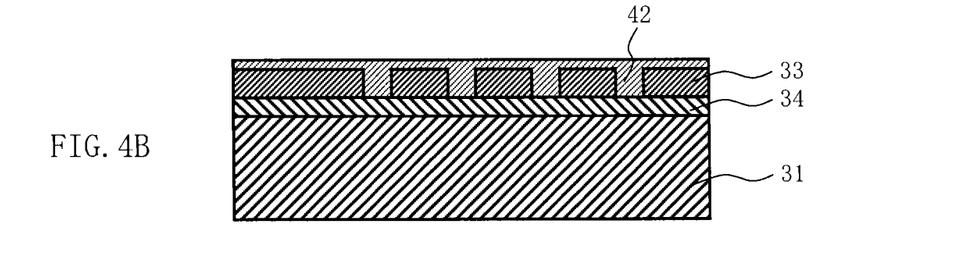
FIG. 4B is a sectional view for describing a process of the method of manufacturing the semiconductor device according to the first embodiment.

(Fifth Step: FIG. 4B)

A second TEOS oxide film 42 is formed on the TEOS oxide film 41 by the LPCVD method like the case of the TEOS oxide film 41.

Figure 4C:
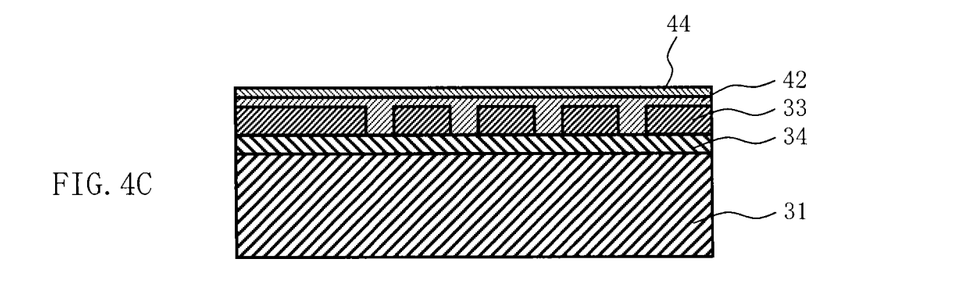
FIG. 4C is a sectional view for describing a process of the method of manufacturing the semiconductor device according to the first embodiment.

(Sixth Step: FIG. 4C)

A Poly-Si film 44 is formed on the surface of the first inorganic thin film 42 with the LPCVD method.

Figure 4D:
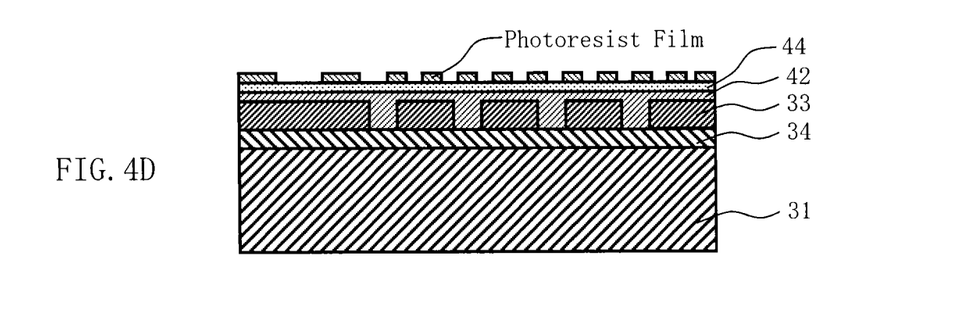
FIG. 4D is a sectional view for describing a process of the method of manufacturing the semiconductor device according to the first embodiment.

(Seventh Step: FIG. 4D)

A photoresist layer is formed on the surface of the Poly-Si film 44, and a pattern of an etching hole is formed on the photoresist layer in accordance with an optical lithography.

Figure 5A:
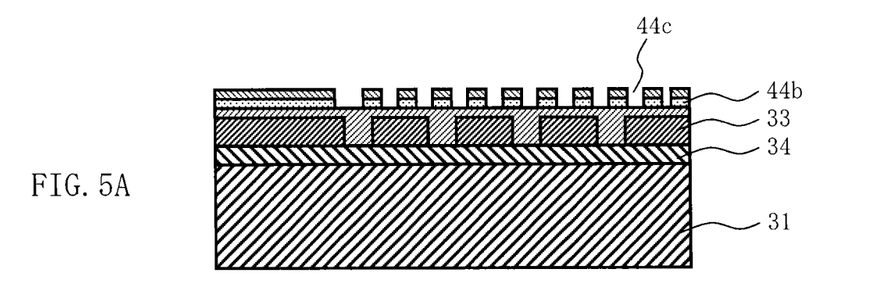
FIG. 5A is a sectional view for describing a process of the method of manufacturing the semiconductor device according to the first embodiment.

(Eighth Step: FIG. 5A)

Then, the Poly-Si film is etched by utilizing the pattern of the photoresist layer as a mask, whereby etching holes 44c are formed on the Poly-Si layer 44 (parts 44b: not etched Poly-Si layer). The etching holes have a function of allowing gaseous HF to pass therethrough. The diameter of each etching hole is preferably within the range of 1 μm to 30 μm.

Figure 5B:
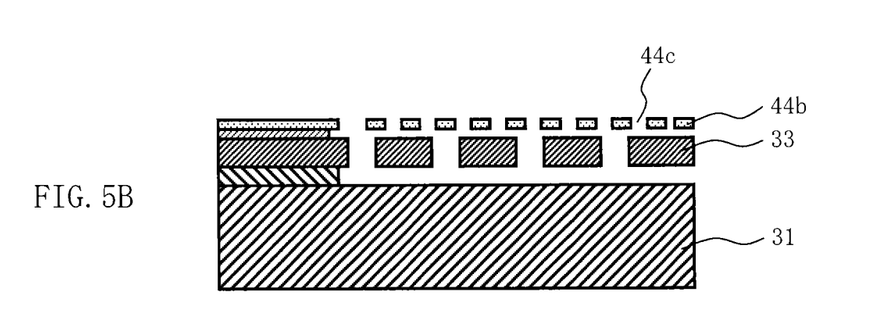
FIG. 5B is a sectional view for describing a process of the method of manufacturing the semiconductor device according to the first embodiment.

(Ninth Step: FIG. 5B)

Then, the gaseous HF treatment is performed through the etching holes 44c on the Poly-Si layer, whereby a part of the TEOS oxide film layers 41 and 42 and the insulating film layer (BOX layer) 34 is etched and removed. Accordingly, the hollow space in which the MEMS element can be operated is formed.

The etching is performed in order to form the hollow space around the MEMS drive portion of the SOI film 33 in such a manner that the hollow space encloses the MEMS drive portion of the SOI film 33. The part of the TEOS oxide film 41 and the insulating film layer (BOX layer) 34 is left to form a wall surface of the hollow space. The etching of a sacrifice layer described above can be performed in such a manner that the substrate to be processed is placed still under the gaseous HF atmosphere of 80 to 100° C. for about 300 to 600 seconds. It is preferable that the concentration of the gaseous HF atmosphere be set to be 5 to 10 vol. %.

Figure 5C:
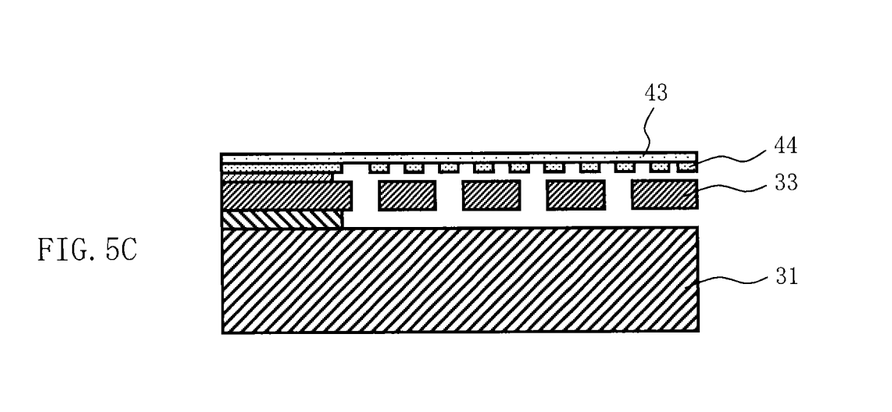
FIG. 5C is a sectional view for describing a process of the method of manufacturing the semiconductor device according to the first embodiment.

(Tenth Step: FIG. 5C)

Then, a second inorganic thin film 43 is formed on the surface of the Poly-Si layer 44 provided with the etching holes. An SiC/Poly-Si film 43 is preferable as the second inorganic thin film. In this process, the Poly-Si layer and the SiC layer are sequentially formed to form a thin film. This film becomes a protective film for sealing the MEMS element. Therefore, it is preferable to use a material excellent in mechanical strength and airtightness. In this process, the second inorganic thin film can be formed by a sputtering method. In this case, it is preferable to use a sputtering method from a diagonal direction with the etching holes used as a shield material in order that sputter metals do not enter the hollow space.

Figure 6A:
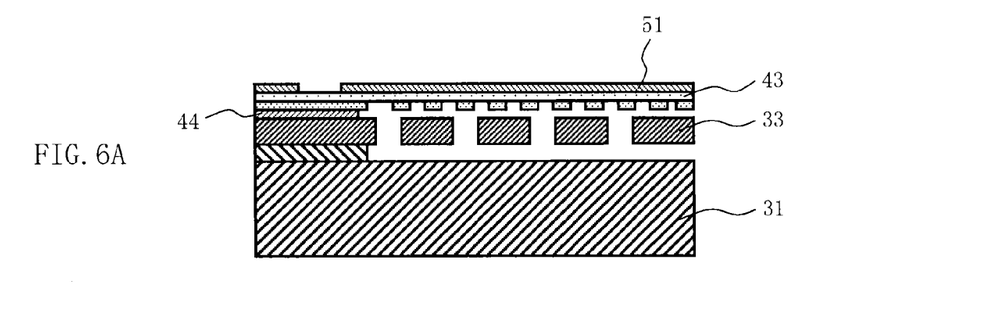
FIG. 6A is a sectional view for describing a process of the method of manufacturing the semiconductor device according to the first embodiment.

(Eleventh Step: FIG. 6A)

Next, a resist 51 is formed on the surface of the SiC/Poly-Si film 43, and then, a via pattern is formed on the resist 51. This process is to form an opening from which an I/O electrode terminal of the MEMS element is taken out.

Figure 6B:
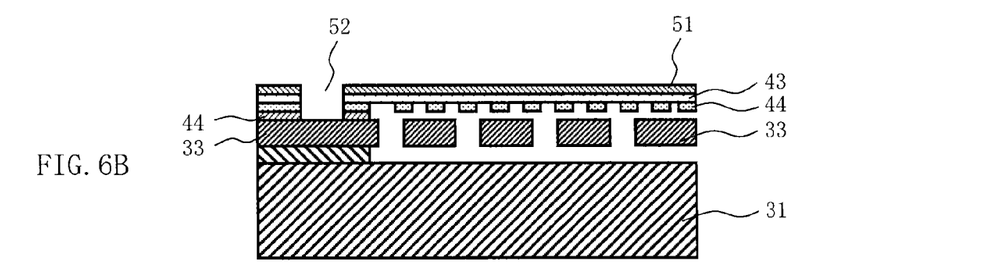
FIG. 6B is a sectional view for describing a process of the method of manufacturing the semiconductor device according to the first embodiment.

(Twelfth Step: FIG. 6B)

The SiC/Poly-Si film 43 serving as the second inorganic thin film and the first inorganic thin film 44 are patterned by using the resist 51 as a mask, whereby an I/O electrode extraction opening 52 that reaches the SOI layer 33 is formed.

Figure 6C:
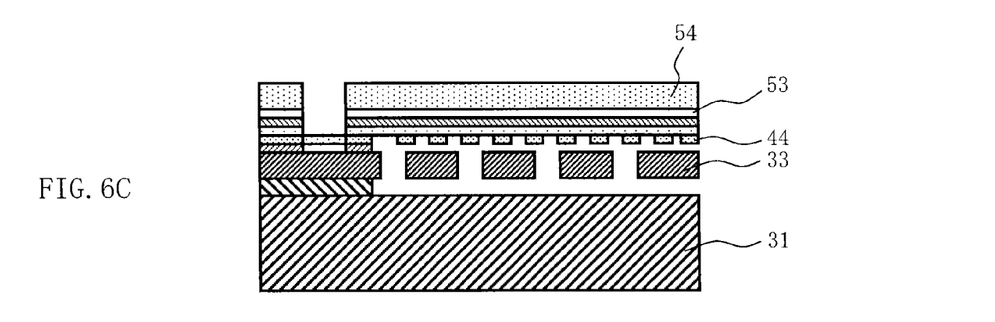
FIG. 6C is a sectional view for describing a process of the method of manufacturing the semiconductor device according to the first embodiment.

(Thirteenth Step: FIG. 6C)

Next, an Al thin film 53, and a Ti thin film 54 are sequentially formed on the whole surface of the substrate 31.

Figure 6D:
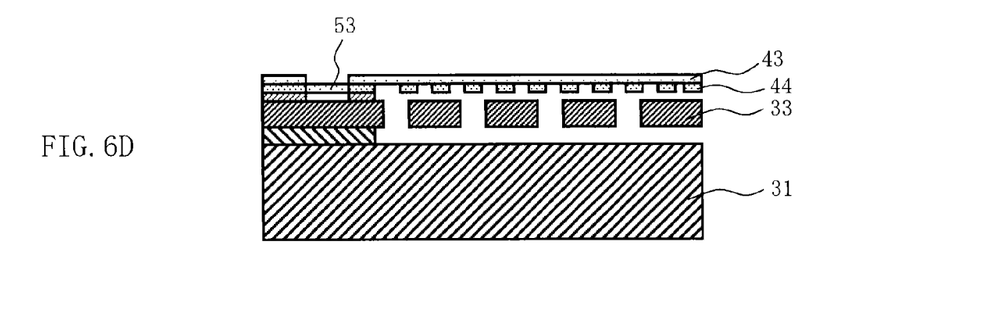
FIG. 6D is a sectional view for describing a process of the method of manufacturing the semiconductor device according to the first embodiment.

(Fourteenth Step: FIG. 6D)

Then, the Al thin film 53 and the Ti thin film 54, which are formed on the region other than the I/O electrode extraction opening 52, are peeled. The Al/Ti stacked thin film used in the thirteenth step is only illustrative, and other metal material such as Au/Ni/Ti stacked thin film can also be employed.

According to the processes described above, the semiconductor device including the MEMS element, having high element integration density, can be formed.

As is apparent from the sectional views illustrating the processes, the hollow structure of the semiconductor device according to the present embodiment is realized by utilizing the thickness of the TEOS oxide film. Therefore, the reliability of the hollow structure is greatly dependent upon the thickness of the TEOS oxide film. It is preferable that the thickness of the TEOS oxide film in the present embodiment be set such that the sealing film is not in contact with the MEMS movable portion due to the stress deformation, in view of the relationship between the thickness of the TEOS oxide film and the deformation amount of the sealing film.

According to need, a columnar member 20 of FIG. 3 preventing the deformation of the sealing film can be arranged on the region of the hollow structure where the operation of the MEMS element is not hindered. The columnar member can be realized as the region where the sacrifice layers are not etched in the hollow structure. The size and the arrangement of the columnar member are not particularly limited. Accordingly, the columnar member is realized by the structure same as the stack structure that realizes the hollow structure.

(Second Embodiment of Method of Manufacturing Semiconductor Device)

Another embodiment of a manufacturing method will be described below with reference to FIGS. 8 to 11.

In FIGS. 7 to 10, the components same as those in FIGS. 3 to 6 are denoted with the same numerals, and the description will be omitted.

Figure 7A:
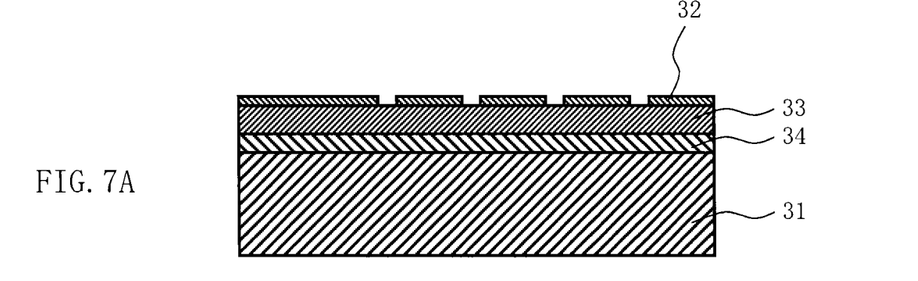
FIG. 7A is a sectional view for describing a process of a method of manufacturing a semiconductor device according to a second embodiment.
Figure 7B:
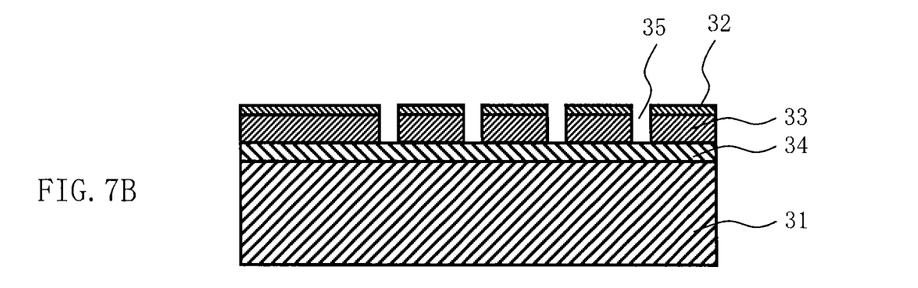
FIG. 7B is a sectional view for describing a process of a method of manufacturing a semiconductor device according to a second embodiment.
Figure 7C:
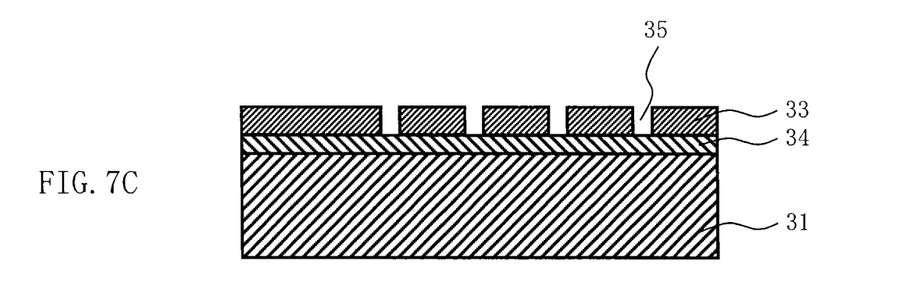
FIG. 7C is a sectional view for describing a process of a method of manufacturing a semiconductor device according to a second embodiment.

(First Step to Third Step: FIGS. 7A to 7C)

These steps are equal to the first step to the third step in FIG. 3 in the above-mentioned embodiment. Therefore, the description will be omitted.

Figure 8A:
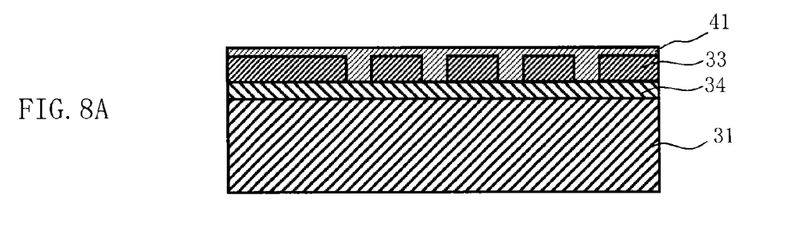
FIG. 8A is a sectional view for describing a process of the method of manufacturing the semiconductor device according to the second embodiment.

(Fourth Step: FIG. 8A)

A TEOS oxide film 41 is formed on the surface of the semiconductor substrate on which the processed trench is formed in the third step described above.

Figure 8B:
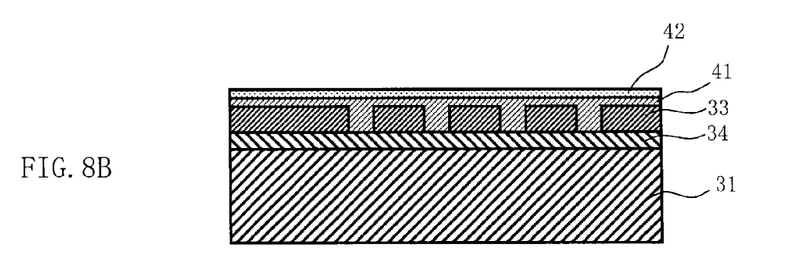
FIG. 8B is a sectional view for describing a process of the method of manufacturing the semiconductor device according to the second embodiment.

(Fifth Step: FIG. 8B)

A first inorganic thin film 42 is formed on the TEOS oxide film 41. A composite material containing the Poly-Si film is preferable for the material of the first inorganic thin film 42. In this process, the first inorganic thin film can be formed by sequentially forming a thin film, made by using a material such as PSG, SiN, or Poly-Si, according to an inorganic thin film forming process that has generally been executed. The first inorganic thin film 42 is required to have excellent permeability to liquid or gas in order to remove the sacrifice layer of the MEMS by etching, and to have impermeability to solid when a second inorganic thin film is formed thereon. The first inorganic thin film 42 is preferably made of a material having a property such as airtightness, mechanical strength, and adhesion property to the TEOS film. In the above-mentioned embodiment, the first inorganic thin film 42 is made of three layers, which are PSG film, SiN film, and Poly-Si film. However, the combination described above is only illustrative, and a material having the above-mentioned properties can be used singly, or the materials described above can be combined to be used.

Figure 8C:
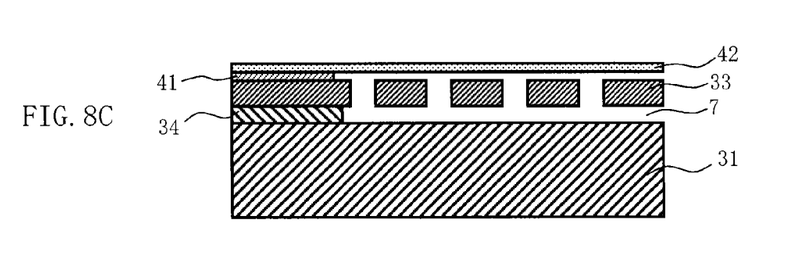
FIG. 8C is a sectional view for describing a process of the method of manufacturing the semiconductor device according to the second embodiment.

(Sixth Step: FIG. 8C)

In this process, a hollow space 7 is formed in the same manner as the ninth step in the first embodiment of the manufacturing method.

Figure 8D:
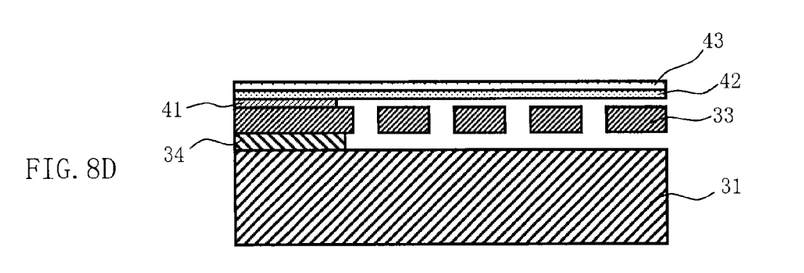
FIG. 8D is a sectional view for describing a process of the method of manufacturing the semiconductor device according to the second embodiment.

(Seventh Step: FIG. 8D)

The second inorganic thin film 43 is formed on the surface of the first inorganic thin film 42. A Poly-Si/SiC film 43 is preferable for the second inorganic thin film. In this process, the Poly-Si layer and the SiC layer are sequentially formed to form a thin film as in the above-mentioned fifth step. This film becomes a protective film for sealing the MEMS element. Therefore, it is preferable to use a material excellent in mechanical strength and airtightness.

Figure 9A:
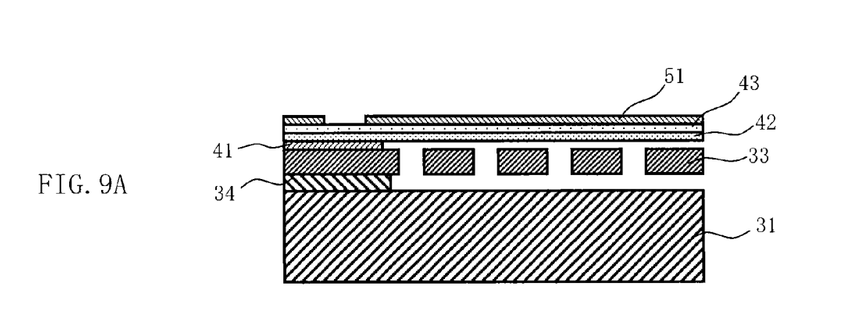
FIG. 9A is a sectional view for describing a process of the method of manufacturing the semiconductor device according to the second embodiment.
Figure 9B:
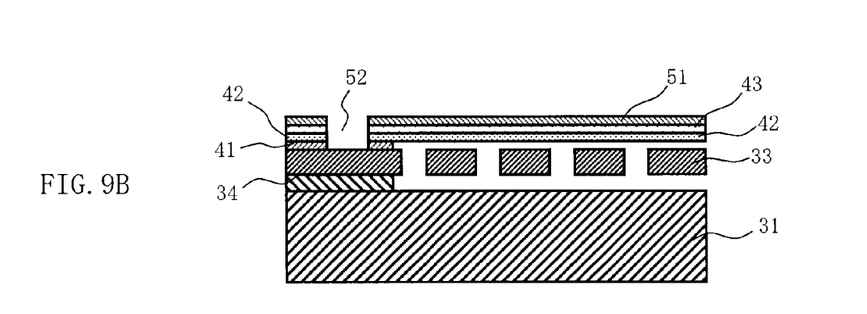
FIG. 9B is a sectional view for describing a process of the method of manufacturing the semiconductor device according to the second embodiment.
Figure 9C:
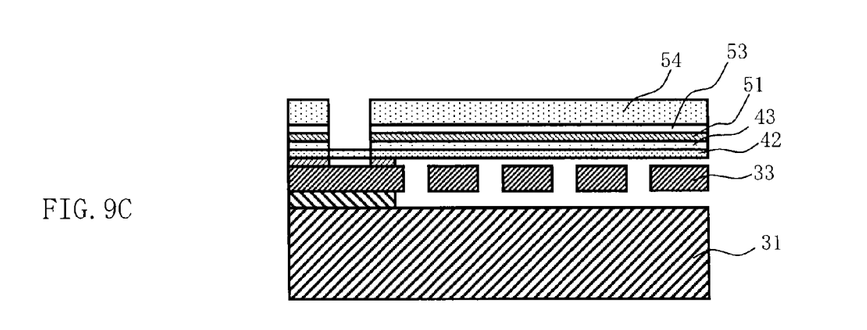
FIG. 9C is a sectional view for describing a process of the method of manufacturing the semiconductor device according to the second embodiment.
Figure 10:
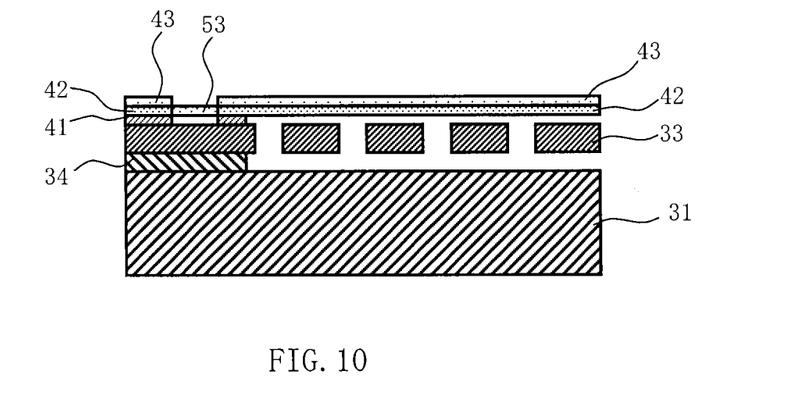
FIG. 10 is a sectional view for describing a process of the method of manufacturing the semiconductor device according to the second embodiment.

(Eighth Step to Eleventh Step: FIG. 9A to FIG. 10)

These processes are the same as the processes in the tenth step (FIG. 6A) to the fourteenth step (FIG. 6D) in the first embodiment, so that the description thereof will be omitted.

According to the processes described above, the semiconductor device including the MEMS element, having high element integration density, can be formed.

As is apparent from the sectional views illustrating the processes, the hollow structure of the semiconductor device according to the present embodiment is preferable, because the process of forming the etching holes on the first inorganic thin film can be omitted.

According to the embodiments described above, the semiconductor package having a hollow-seal structure can be manufactured with the use of the thin film equivalent to a passivation film of a semiconductor device. Therefore, the semiconductor package having the hollow structure formed by using the thin film, which has conventionally been difficult to realize, is realized as a wafer level chip scale package, whereby an electronic device can be mounted with high density.

EXAMPLE

The embodiments will be described in more detail with reference to an example.

This example includes a process of forming a TEOS oxide film on a semiconductor element; a process of forming a first inorganic thin film including a Poly-Si film on the TEOS oxide film; a process of forming an etching hole opening on the first inorganic thin film; and a process of removing the TEOS oxide film through etching by a gaseous HF through the etching opening on the first inorganic thin film.

The example will more specifically be described below with reference to FIGS. 3 to 6. As illustrated in FIGS. 3A to 3C, an oxide layer 34 is formed on a semiconductor substrate 31, and an SOI layer 33 is formed on the surface of the oxide layer 34. Then, a part of the SOI layer is removed by employing Deep RIE method, in order to form an MEMS movable portion 33.

Next, as illustrated in FIGS. 4A to 4D, TEOS oxide films 41 and 42 are formed with an LPCVD process in order to fill the processed trench between the MEMS movable portions 33, which are arranged side by side. A Poly-Si film serving as a first inorganic thin film is deposited onto its surface, and then, a resist film (SU-8) provided with a pattern for forming etching holes on the Poly-Si film is formed.

Subsequently, as illustrated in FIGS. 5A to 5C, etching holes are formed on the Poly-Si by using the resist film, and then, the SU-8 film is peeled. Thereafter, the Poly-Si film and SiC film are sequentially formed to form a second inorganic thin film 43.

Next, as illustrated in FIGS. 6A to 6D, an opening 52 for extracting an electrode terminal is formed on the second inorganic thin film 43, and a metal layer is deposited in the opening so as to form an I/O electrode 53.

In the present embodiment, the insulating film layer (BOX layer) and the TEOS film, which constitute the sacrifice layer, are removed by etching with the gaseous HF passing through the first inorganic thin film, and the Poly-Si/SiC film is deposited as the uppermost layer in order to enhance rigidity and airtightness of the MEMS sealing film.

With the processes described above, the semiconductor device, illustrated in FIG. 1 (or FIG. 2), in which the MEMS movable portion is sealed airtight, can be manufactured in a wafer level.

The semiconductor device manufactured with the processes described above was evaluated. A semiconductor chip of 2.9 mm×2.9 mm×0.65 mm needs an outer dimension of 3.5 mm×3.5 mm×1.5 mm, when it is sealed by using a conventional sealing material that is formed to have a concave portion on a silicon substrate. However, according to the manufacturing method of the present invention, the semiconductor chip can be sealed in a wafer level with the outer dimension of 2.9 mm×2.9 mm×0.75 mm, which means that the volume ratio is reduced by 34% compared to the conventional technique. Accordingly, the semiconductor device can be more downsized.

The hollow section cannot be maintained to have high vacuum state according to the conventional sealing film formed by bonding an organic resin film. However, in the present embodiment, the degree of vacuum of the hollow section can be increased up to −75 MPa, which verifies that the reliability is remarkably enhanced.

When a connection reliability of the semiconductor device according to the present embodiment was evaluated, the result described below was obtained. Specifically, a sample was prepared in such a manner that the semiconductor device having a size of 2.9 mm×2.9 mm×0.75 mm, illustrated in FIGS. 1 and 2, which was used for describing the example of the semiconductor device of the present embodiment, was integrated with a driving semiconductor chip with the integration technique described in Japanese Patent Application Laid-Open No. 2007-260866. The connection reliability of the sample was evaluated. The case in which at least one of 256 pins is disconnected is specified as a defective case. An axis of ordinate represents an accumulated defective percent, while an axis of abscissa represents a temperature cycle. 1000 samples were evaluated under the test condition of the temperature cycle of (−55° C.(30 min) to 25° C.(5 min) to 125° C.(30 min) to 25° C.(5 min)).

As a result, in the semiconductor device in which the sealing according to the present technique was performed, the defective connection was not observed up to 3000 cycles, as in the conventional semiconductor device in which the sealing was performed by the silicon substrate having the concave portion formed thereon. Therefore, it was confirmed that the semiconductor device according to the present embodiment had reliability as an integrated semiconductor device.

In the above-mentioned example, the etching holes are formed on the first inorganic thin film, and the TEOS oxide film layer and the insulating film layer (BOX layer) are removed by etching so as to form the hollow space. When a semiconductor device is manufactured, as in the same manner in the above-mentioned embodiment, by using a thin film having micropores, without forming the etching holes, the result same as the above-mentioned semiconductor device is obtained.

The embodiments of the present invention have been described above, but they are only illustrative, and they do not limit the scope of the present invention. Novel embodiments can be executed in other various forms, and various omissions, replacements, modifications are possible without departing from the scope of the present invention. The embodiments and modifications are included in the scope and gist of the present invention, and also included in the inventions described in the claims and in the equivalent scope.

What is claimed is:

1. A method of manufacturing a semiconductor device having a surface of a semiconductor substrate on which plural semiconductor elements are formed, the method comprising:

forming an insulating film layer (Buried Oxide (BOX) layer) on a surface of a semiconductor substrate;

forming an SOI (Silicon on Insulator) layer on a surface of the insulating film layer (BOX layer);

removing a part of the SOI layer to form a movable portion of an electromechanical element;

forming a TEOS (Tetra Ethyl Ortho Silicate) oxide film on a surface of the SOI layer and the insulating film layer (BOX layer) that is exposed through etching of the SOI layer;

forming an inorganic thin film on a surface of the TEOS oxide film, the inorganic thin film including a first Poly-Si (Poly-Silicon) film;

forming a resist mask on the first Poly-Si film;

forming etching holes by removing a part of the first Poly-Si film using the resist mask as an etching mask;

removing a part of the insulating film layer (BOX layer) and the TEOS oxide film through a gas-phase HF (Hydrogen Fluoride) treatment to the semiconductor substrate so as to form a hollow portion in which the movable portion of the electromechanical element is arranged and is separated from the semiconductor substrate, the TEOS oxide film, and the inorganic thin film; and sealing the semiconductor device by forming a second Poly-Si (Poly-Silicon) film or an SiC (Silicon Carbide) film on the first Poly-Si film having the etching holes, wherein the etching holes of the first Poly-Si film are present after the formation of the second Poly-Si film or the SiC film.

2. The method of manufacturing a semiconductor device according to claim 1, further comprising forming an I/O (input/output) electrode, which establishes an electrical connection to an external circuit, on the TEOS oxide film.

3. The method of manufacturing a semiconductor device according to claim 1, wherein one of the plural semiconductor elements is an electromechanical element or a compound semiconductor element.

4. The method of manufacturing a semiconductor device according to claim 1, wherein the movable portion is formed between the inorganic thin film and the semiconductor substrate.

5. The method of manufacturing a semiconductor device according to claim 1, wherein diameters of the etching holes are within a range of 1 μm to 30 μm.

6. The method of manufacturing a semiconductor device according to claim 5, wherein the second Poly-Si film or the SiC film is formed by a sputtering method.

7. The method of manufacturing a semiconductor device according to claim 5, wherein the second Poly-Si film or the SiC film is formed by a sputtering method from a diagonal direction with the etching holes.

8. The method of manufacturing a semiconductor device according to claim 5, wherein the first Poly-Si film having etching holes is used as a mask when the part of the insulating film layer (BOX layer) and the TEOS oxide film are removed.

* * * * *